*(12)* United States Patent
Chuang et al.

(10) Patent No.: US 7,952,422 B2
(45) Date of Patent: May 31, 2011

(54) METHODS AND APPARATUS FOR VARYING A SUPPLY VOLTAGE OR REFERENCE VOLTAGE USING INDEPENDENT CONTROL OF DIODE VOLTAGE IN ASYMMETRICAL DOUBLE-GATE DEVICES

(75) Inventors: Ching-Te Chuang, South Salem, NY (US); Keunwoo Kim, Somers, NY (US); Jente Benedict Kuang, Austin, TX (US); Hung Cai Ngo, Williamson County, TX (US); Kevin John Nowka, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/511,658

(22) Filed: Jul. 29, 2009

(65) Prior Publication Data

US 2009/0302929 A1    Dec. 10, 2009

Related U.S. Application Data

(62) Division of application No. 11/216,666, filed on Aug. 31, 2005.

(51) Int. Cl.
*H03K 3/01* (2006.01)
(52) U.S. Cl. ........................ 327/534; 327/544
(58) Field of Classification Search .................. 327/534, 327/540, 544; 713/320, 322
See application file for complete search history.

(56) References Cited

U.S. PATENT DOCUMENTS

| | | | | |
|---|---|---|---|---|
| 5,274,601 | A * | 12/1993 | Kawahara et al. | 365/230.06 |
| 5,689,144 | A * | 11/1997 | Williams | 307/130 |
| 5,757,242 | A * | 5/1998 | Chow et al. | 331/57 |
| 5,801,570 | A * | 9/1998 | Mizuno et al. | 327/362 |
| 5,812,860 | A * | 9/1998 | Horden et al. | 713/322 |
| 5,821,769 | A * | 10/1998 | Douseki | 326/34 |
| 6,097,065 | A * | 8/2000 | Forbes et al. | 257/350 |
| 6,104,068 | A * | 8/2000 | Forbes | 257/365 |
| 6,414,356 | B1 * | 7/2002 | Forbes et al. | 257/350 |
| 6,433,609 | B1 * | 8/2002 | Voldman | 327/313 |
| 6,448,840 | B2 * | 9/2002 | Kao et al. | 327/534 |
| 6,580,293 | B1 * | 6/2003 | Bernstein et al. | 326/95 |
| 6,859,084 | B2 * | 2/2005 | Stansfield et al. | 327/325 |
| 6,864,708 | B2 * | 3/2005 | Takahashi et al. | 326/33 |
| 6,867,637 | B2 * | 3/2005 | Miyazaki et al. | 327/534 |

(Continued)

OTHER PUBLICATIONS

Nowak et al., "Turning Silicon on its Edge," IEEE Circuits & Devices Magazine, pp. 20-31, Jan./Feb. 2004.

(Continued)

*Primary Examiner* — Kenneth B. Wells
(74) *Attorney, Agent, or Firm* — Ryan, Mason & Lewis, LLP

(57) ABSTRACT

Methods and apparatus are provided for varying one or more of a supply voltage and reference voltage in an integrated circuit, using independent control of a diode voltage in an asymmetrical double-gate device. An integrated circuit is provided that is controlled by one or more of a supply voltage and a reference voltage. The integrated circuit comprises an independently controlled asymmetrical double-gate device to adjust one or more of the supply voltage and the reference voltage. The independent control may comprise, for example, a back gate bias. The independently controlled asymmetrical double-gate device may be employed in a number of applications, including voltage islands, static RAM, and to improve the power and performance of a processing unit.

6 Claims, 5 Drawing Sheets

U.S. PATENT DOCUMENTS

| | | | |
|---|---|---|---|
| 6,947,865 B1 * | 9/2005 | Mimberg et al. | 702/130 |
| 6,969,656 B2 * | 11/2005 | Du et al. | 438/268 |
| 6,996,730 B2 * | 2/2006 | Bonnett | 713/322 |
| 7,019,342 B2 * | 3/2006 | Hackler et al. | 257/250 |
| 7,056,773 B2 * | 6/2006 | Bryant et al. | 438/142 |
| 7,321,254 B2 * | 1/2008 | Li et al. | 327/534 |

OTHER PUBLICATIONS

Zhang et al., "A 3-GHz 70Mb SRAM in 65nm CMOS Technology with Integrated Column-Based Dynamic Power Supply," 2005 IEEE International Solid State Circuits Conference, Session 26/Non-Volatile Memory, pp. 474-475 (2005).

U.S. Appl. No. 11/106,913, filed Apr. 5, 2005, Keunwoo et al.

Nowak et al, "Turning Silicon on its Edge," IEEE Circuits & Devices Magazine, pp. 20-31, Jan./Feb. 2004.

Zhang et al, "A 3-GHz 70Mb SRAM in 65nm CMOS Technology with Integrated Column-Based Dynamic Power Supply," 2005 IEEE International Solid State Circuits Conference, Session 26/Non-Volatile Memory, pp. 474-475 (2005).

* cited by examiner

METHODS AND APPARATUS FOR VARYING A SUPPLY VOLTAGE OR REFERENCE VOLTAGE USING INDEPENDENT CONTROL OF DIODE VOLTAGE IN ASYMMETRICAL DOUBLE-GATE DEVICES

CROSS-REFERENCE TO RELATED APPLICATIONS

This application is a divisional of U.S. patent application Ser. No. 11/216,666, filed Aug. 31, 2005, incorporated by reference herein.

STATEMENT OF GOVERNMENT RIGHTS

This invention was made with Government support under Contract No. NBCH3039004 awarded by Defense Advanced Research Projects Agency (DARPA). The Government has certain rights in this invention.

FIELD OF THE INVENTION

The present invention relates generally to techniques for varying a voltage by a diode voltage in various integrated circuits and, more particularly, to techniques for providing a variable diode voltage using independently controlled asymmetrical double-gate devices.

BACKGROUND OF THE INVENTION

A number of techniques have been proposed or suggested for containing power/leakage, improving performance, and extending scaling, including voltage islands, dynamic $V_{DD}$, and separate supplies for logic and SRAM. For example, one commonly used technique drops the supply voltage (or raises the Ground voltage) through a metal oxide semiconductor (MOS) diode by one threshold voltage, $V_T$. MOS diodes are also widely used in power-gating structures for logic and static random access memories (SRAM) to clamp the virtual $V_{DD}$ or virtual Ground (or both) to maintain adequate voltage across the memory elements for proper state retention, as illustrated in FIG. 1. FIG. 1 is a circuit diagram of a conventional CMOS circuit 100 having an integrated circuit 150, such as logic or memory elements, a power-gating switch 110 and a diode clamp 120.

It is desirable to have a variable $V_T$ diode to compensate for process variations, $V_T$ fluctuations or both. Furthermore, in SRAM applications, it is desirable to have a higher supply voltage during a read operation to maintain adequate noise margin, and a lower supply voltage during a write operation to facilitate writing. While well/body bias in bulk CMOS or PD/SOI devices have been proposed for used in modulating the threshold voltage, $V_T$, the effect, in general, is quite limited. FIG. 2 is a schematic cross-section of a bulk-Si (or SOI) field effect transistor (FET) 200. As shown in FIG. 2, a large reverse well/body bias 220 causes an exponential increase in the reverse junction leakage including band-to-band tunneling current, while a forward well/body bias 210 results in an exponential increase in the forward diode leakage. Furthermore, it is known that the $V_T$ modulation effect diminishes with device scaling due to a low body factor in the scaled, low $V_T$ transistor. Finally, the distributed RC for the well/body contact limits the viable operating frequency.

E. Nowak et al., "Turning Silicon on its Edge," IEEE Circuits Devices Mag. 20-31 (January/February, 2004), incorporated by reference herein, discloses a $V_T$ modulation technique that employs double-gate devices. The disclosed $V_T$ modulation technique uses asymmetrical gates, where the two gate electrodes consist of materials of differing work functions. FIG. 3 is a schematic cross-section of an asymmetrical double-gate nFET 300. As shown in FIG. 3, the front gate 310 typically uses n+ polysilicon and the back gate 320 typically consists of p+ polysilicon. For an asymmetrical pFET, a p+ polysilicon gate would be used for the front-gate and an n+ polysilicon gate would be used for the back-gate. In such an implementation, the predominant front-channel has a significantly lower $V_T$ and much larger current drive compared with the "weak" back-channel.

As shown in FIG. 3, the disclosed asymmetrical double-gate devices couple the front gate and back gate using a connection 330. The threshold voltage, $V_T$, is a function of the fixed back gate voltage. Thus, the disclosed asymmetrical double-gate devices cannot be used to provide a variable $V_T$ diode and thereby control the virtual $V_{DD}$ or virtual Ground in the integrated circuit 100 of FIG. 1. A need exists for improved techniques for variable $V_T$ modulation. A further need exists for techniques for varying a supply voltage or a reference voltage (or both) using independently controlled asymmetrical double-gate devices.

SUMMARY OF THE INVENTION

Generally, methods and apparatus are provided for varying one or more of a supply voltage and reference voltage in an integrated circuit, using independent control of a diode voltage in an asymmetrical double-gate device. According to one aspect of the invention, an integrated circuit is provided that is controlled by one or more of a supply voltage and a reference voltage. The integrated circuit comprises an independently controlled asymmetrical double-gate device to adjust one or more of the supply voltage and the reference voltage. The independent control may comprise, for example, a back gate bias. In a pMOS implementation, the asymmetrical double-gate device comprises a p+ polysilicon gate for a first gate; and an n+ polysilicon gate for a second gate, wherein the threshold voltage, $V_T$, is independently controlled by a bias of the first or second gates.

According to another aspect of the invention, a plurality of voltage islands may be provided in an integrated circuit that each provide a different voltage level. Each voltage island comprises an independently controlled asymmetrical double-gate device to provide one of the different voltage levels. According to yet another aspect of the invention, a power gating circuit is provided that comprises at least one integrated circuit; and an independently controlled asymmetrical double-gate device that provides a variable threshold voltage, $V_T$. The power gating circuit may also comprise an asymmetrical double-gate device to serve as a power switch. The independently controlled asymmetrical double-gate device of the present invention may also be employed in static RAM devices having a plurality of memory cells. Each memory cell has an independently controlled asymmetrical double-gate device that provides a variable threshold voltage, $V_T$.

In addition, the adjusted back-gate bias can be employed in a processing unit to improve power and performance of the processing unit. A processor unit according to the present invention comprises: (i) an oscillator; (ii) at least one independently controlled asymmetrical double-gate device that provides a variable threshold voltage, $V_T$; (iii) a phase detector to compare an output of the oscillator to a reference signal; and (iv) a charge pump to adjust a back-gate bias of the at least one independently controlled asymmetrical double-gate device based on the comparison.

A more complete understanding of the present invention, as well as further features and advantages of the present invention, will be obtained by reference to the following detailed description and drawings.

DETAILED DESCRIPTION OF PREFERRED EMBODIMENTS

Figure 1:
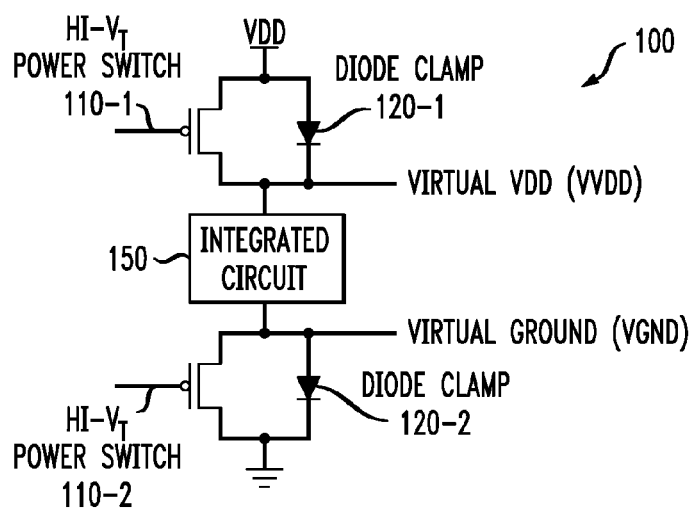
FIG. 1 is a circuit diagram of a CMOS circuit.
Figure 2:
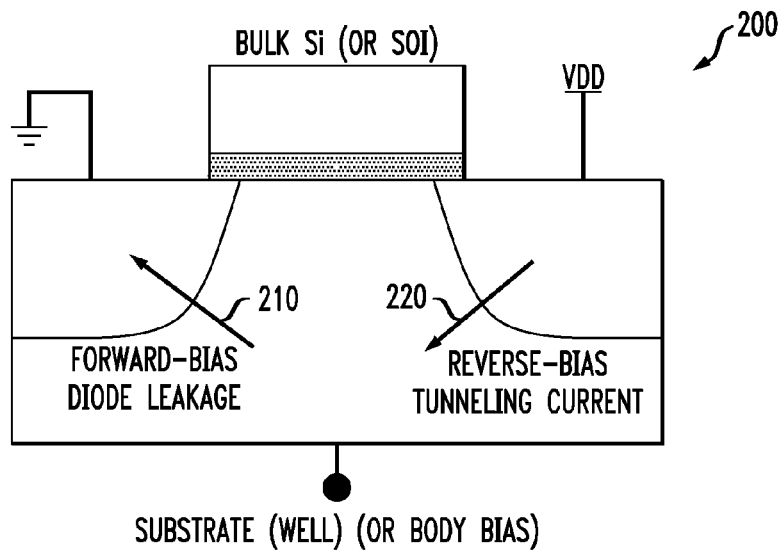
FIG. 2 is a schematic cross-section of a bulk-Si (or SOI) field effect transistor.

The present invention provides techniques for varying a supply voltage or a reference voltage using one or more independently controlled asymmetrical double-gate devices. The present invention recognizes that the front-channel $V_T$ (and current) of the asymmetrical double-gate devices can be modulated using independent control, such as back-gate biasing, through gate-to-gate coupling. This $V_T$ modulation mechanism is significantly stronger than the existing well body bias in bulk CMOS and PD/SOI devices, as discussed above in conjunction with FIG. 2. Furthermore, the effect improves with device scaling due to stronger gate-to-gate coupling in thinner film or thinner gate oxides (or both), and the frequency is only limited by the gate RC, in the same manner as core logic.

Figure 4:
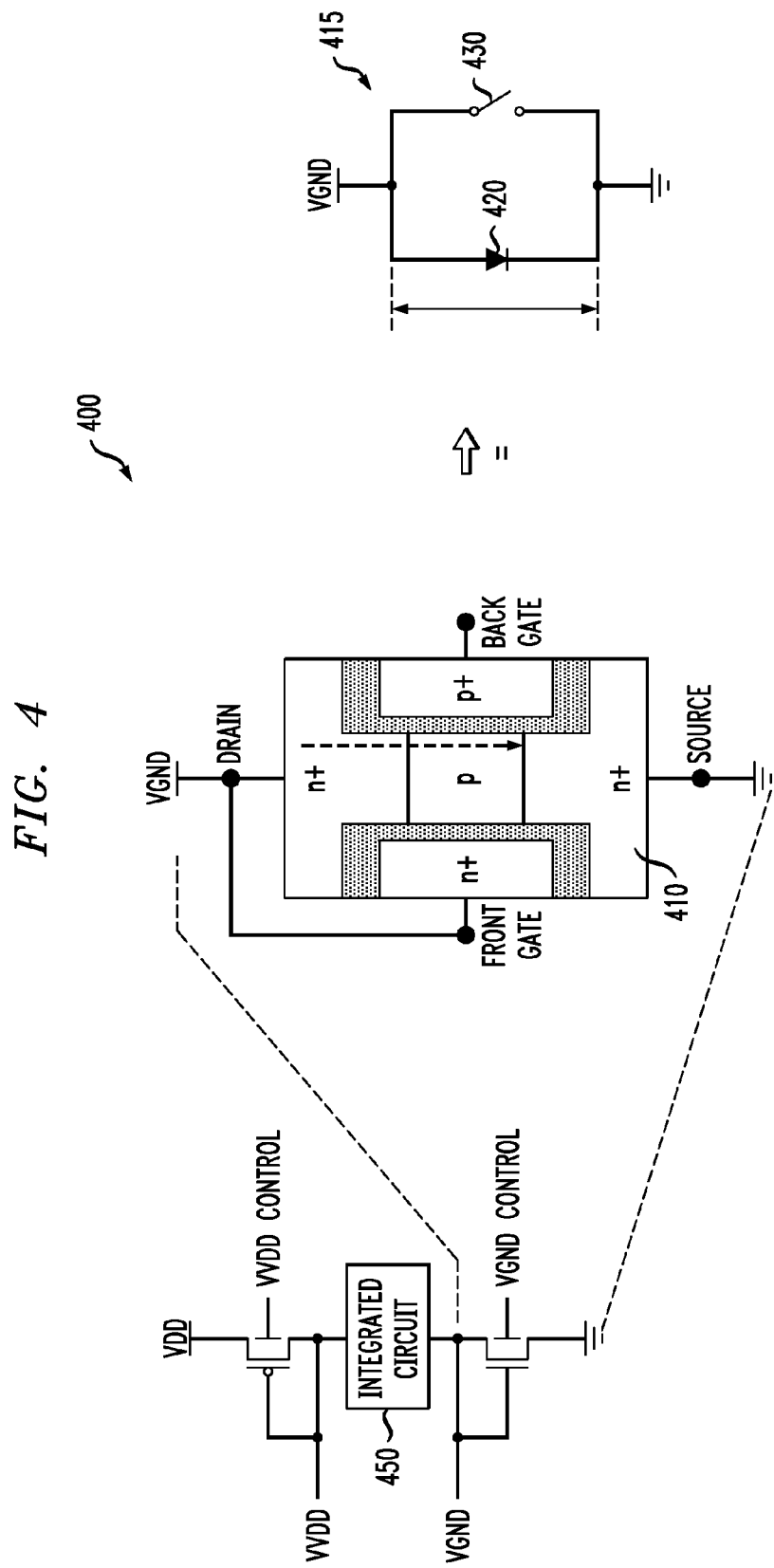
FIG. 4 is a circuit diagram of a CMOS circuit incorporating features of the present invention.

According to one aspect of the invention, a variable threshold voltage, $V_T$, is provided using independently controlled asymmetrical double-gate devices. FIG. 4 is a circuit diagram of a CMOS circuit 400 incorporating features of the present invention. As shown in FIG. 4, the CMOS circuit 400 comprises an integrated circuit 450, such as logic or memory elements, and one or more asymmetrical double-gate nFET devices 410, for example, associated with the virtual ground (footer) or virtual supply voltage (header), or both.

In the exemplary embodiment of FIG. 4, the virtual ground (VGND) is clamped by the diode connected front gate of an asymmetrical double-gate nFET device 410 that uses an n+ polysilicon gate for the front-gate and a p+ polysilicon gate for the back-gate. In addition, the drain terminal of the asymmetrical double-gate nFET device 410 is coupled to the front gate, as shown in FIG. 4. The back gate of the asymmetrical double-gate device 410 is used to independently control the voltage drop across the MOS diode 420, using a bias signal, VGND control.

It is noted that the circuit 415 is an equivalent representation of the asymmetrical double-gate nFET device 410. The diode 420 represents the strong current associated with the front gate of the asymmetrical double-gate nFET device 410, and the open circuit 430 represents the very small current associated with the back gate of the asymmetrical double-gate nFET device 410.

Although not shown in FIG. 4, the virtual VDD (VVDD) can also be clamped by an independently controlled asymmetrical double-gate pFET device that uses a p+ polysilicon gate for the front-gate and an n+ polysilicon gate for the back-gate. The back gate of the asymmetrical double-gate device 410 would be used to independently control the voltage drop across the MOS diode 420, using a bias signal, VVDD control.

As previously indicated, the exemplary back-gate biasing of the asymmetrical double-gate device 410 is used to modulate the front-gate $V_T$ through gate-to-gate coupling. Since the diode drop ($V_d$) is physically associated with $V_T$ and the $V_T$ modulation effect is significant, the disclosed independently controlled asymmetrical double-gate devices 410 can provide a wide range of diode voltage for clamping VGND or VVDD (or both).

Among other benefits, the disclosed asymmetrical double-gate devices are scalable as the gate-to-gate coupling effect improves with device scaling (for thin silicon film and thin gate dielectric). In addition, the operating frequency is only limited by the gate RC (in a similar manner to the core logic. The disclosed asymmetrical double-gate devices are area efficient since a single device is used for the diode and tuning. Moreover, in power-gating applications, the diode can also serve as the power switch, thus further improving the area, density, power, and performance. The back-gate bias does not increase the junction leakage, while well-body bias can cause significant increase in reverse/forward junction leakage and band-to-band tunneling leakage. Finally, in dynamic $V_{DD}$ applications, the burden of charge movement to charge/discharge of voltage rail capacitance is smaller than that of an equivalent parallel pass gate voltage switch. As a result, the virtual supply settling time can be shorter in design.

As discussed hereinafter, the wide tuning range for the diode voltage makes the present invention useful for the following applications:

(1) Dynamic Von;
(2) Voltage islands;
(3) Power gating;
(4) Separate $V_{DD}$ for logic and SRAM;
(5) Dynamic $V_{DD}$ for SRAM Read/Write (High $V_{DD}$ for Read, low $V_{DD}$ for Write); and
(6) Compensation for process variations and $V_T$ fluctuation.

The present invention is well suited for emerging asymmetrical double-gate technologies including planar double-gate devices, FinFETs, and TriGate technologies. The present invention is also applied to fully depleted SOI devices with back-gating capability.

Voltage Islands

Figure 5:
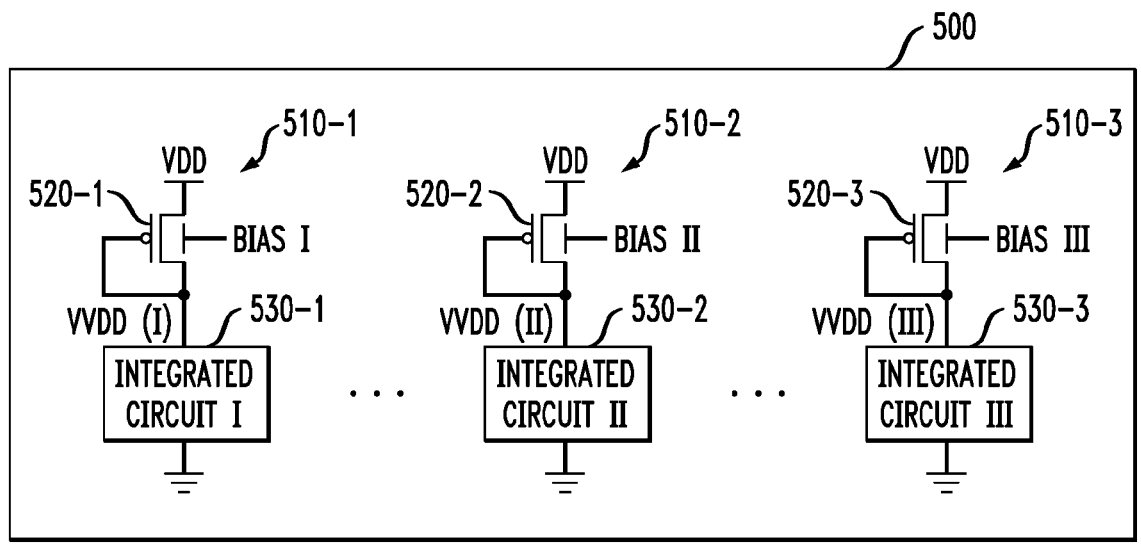
FIG. 5 illustrates a plurality of voltage islands incorporating one or more independently controlled asymmetrical double-gate devices of the present invention.

FIG. 5 illustrates an integrated circuit 500 having a plurality of voltage islands 510-1 through 510-3 incorporating one or more independently controlled asymmetrical double-gate devices 520 of the present invention. As shown in the exemplary embodiment of FIG. 5, individual independently controlled diode-connected asymmetrical double-gate pFETs 520-1 through 520-3, each with different back-gate biases, bias I through bias III, are used to provide different virtual $V_{DD}$s for corresponding individual voltage islands 510-1 through 510-3. For example, each sub-circuit 530-1 through 530-3 may need a different supply voltage, provided by a corresponding voltage island 510.

Power Gating

Figure 3:
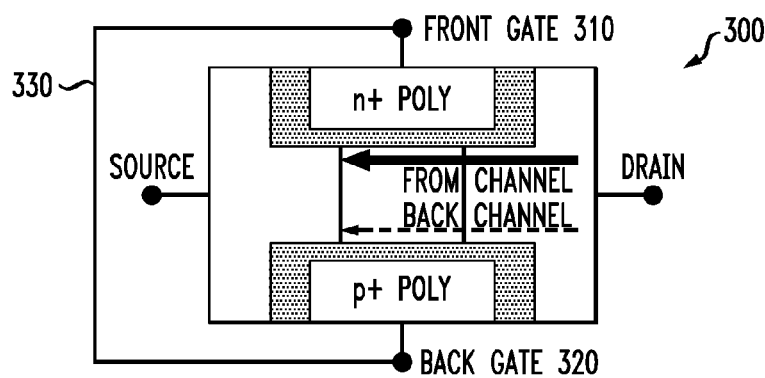
FIG. 3 is a schematic cross-section of an asymmetrical double-gate nFET employed by the present invention.
Figure 6:
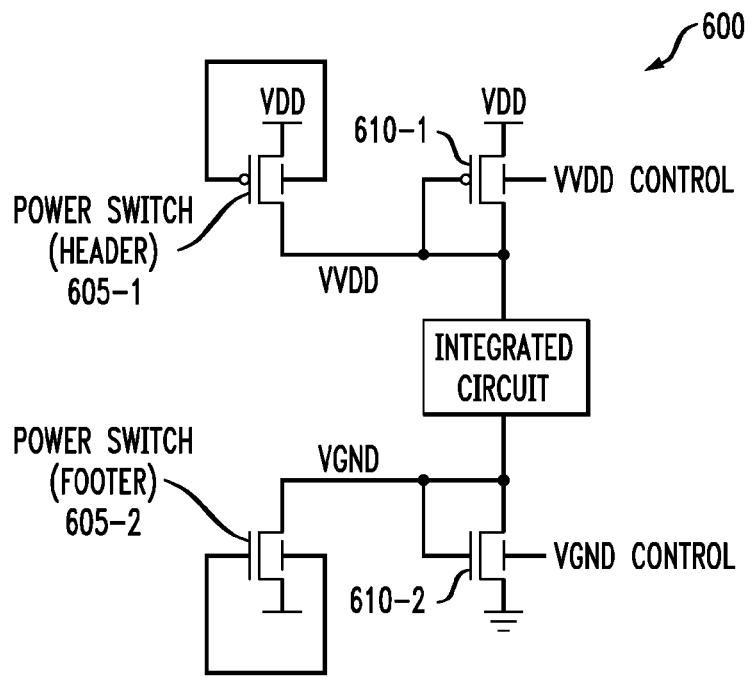
FIG. 6 illustrates a power gating structure incorporating one or more independently controlled asymmetrical double-gate devices of the present invention.

FIG. 6 illustrates a power gating structure 600 incorporating one or more independently controlled asymmetrical double-gate devices 610 of the present invention. The power gating structure 600 of FIG. 6 improves the speed, relative to the implementation of FIG. 4. Generally, two transistors are employed to provide higher currents and faster speed. The power switches 605 are embodied as front gate to back gate coupled asymmetrical double-gate devices 300 (FIG. 3).

In an active mode, the corresponding power switch 605 is ON and the back gate is ON. The power switch 605 shunts the diode and the virtual GND is close to GND (and the virtual $V_{DD}$ is close to $V_{DD}$). In a standby mode, the power switch 605 is OFF, and the back-gates are biased to provide the proper diode voltages to clamp the virtual GND and virtual $V_{DD}$ at the desired levels. It is noted that due to the capability of wide range diode voltage provided by the present invention, the power switches 605 can actually be removed. With the back-gate biased at full $V_{DD}$ to the footer or at full "0" to the header, the diode voltage drops are negligible, and the diodes themselves can serve as the power switches as well.

Separate $V_{DD}$ for Logic and SRAM

Figure 7:
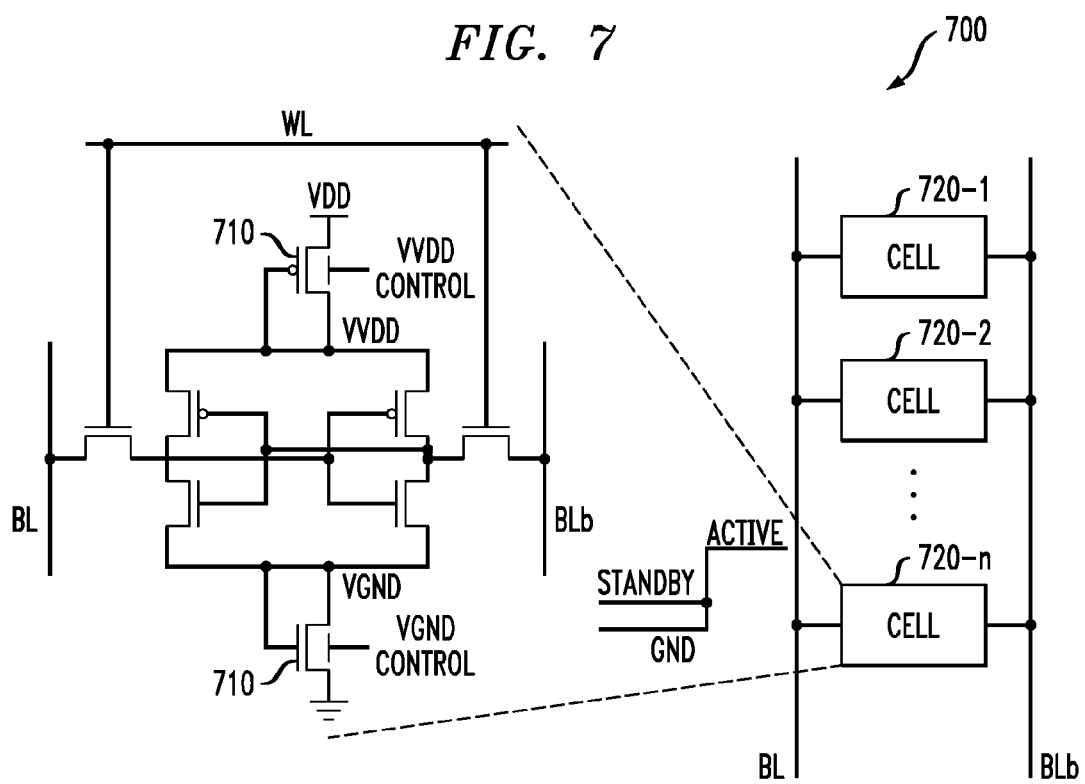
FIG. 7 illustrates the relevant portions of an SRAM incorporating one or more independently controlled asymmetrical double-gate devices in each cell according to the present invention.

FIG. 7 illustrates the relevant portions of an SRAM 700 incorporating one or more independently controlled diode-connected asymmetrical double-gate devices 710 according to the present invention in one or more cells 720-1 through 720-n. In the implementation shown in FIG. 7, the independently controlled diode-connected asymmetrical double-gate devices 710 serve both as the power switches and the variable diode-voltage clamps. In a standby mode, the diode voltages can be tuned to maintain adequate voltage across the cells for state retention and to reduce the leakage current. FIG. 7 illustrates the levels for VGND control and the levels for VVDD control would be complementary, as would be apparent to a person of ordinary skill.

Dynamic $V_{DD}$ for SRAM Read/Write

According to another aspect of the invention, the disclosed back-gate controlled variable diode-drop scheme can be applied to a dynamic Read/Write supply voltage for SRAM. As previously indicated, for SRAMs in scaled technologies, it is desirable to have a higher supply voltage during a read operation, to maintain an adequate noise margin, and a lower supply voltage during a write operation, to facilitate writing.

Figure 8:
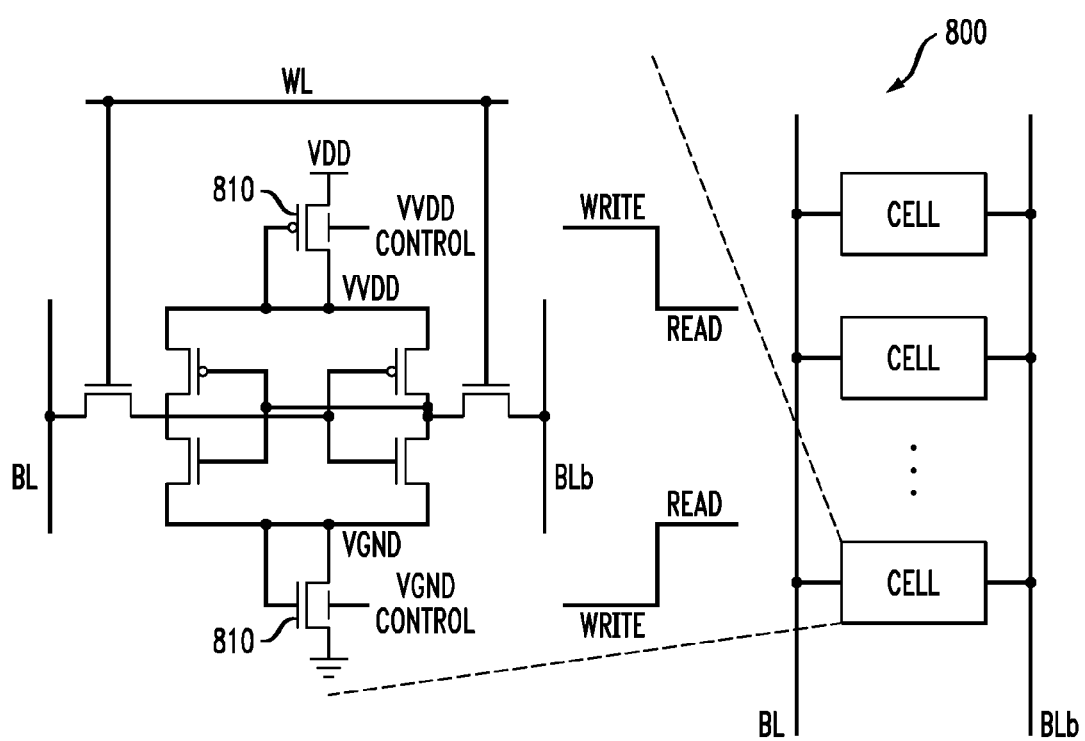
FIG. 8 illustrates a column based dynamic $V_{DD}$ scheme for Read/Write operations in an SRAM using one or more independently controlled variable diode-drop asymmetrical double-gate devices.

FIG. 8 illustrates a column based dynamic $V_{CC}$ scheme for Read/Write operations in an SRAM 800 using one or more independently controlled variable diode-drop asymmetrical double-gate devices 810. The implementation shown in FIG. 8 has the following advantages:

(a) only one regular supply is required and the back-gate bias is used to control/change the voltage across the SRAM cells (conventional techniques require two external power supplies, or the use of on-chip voltage generator/regulator to provide the extra supply level);

(b) requires only a header diode or a footer diode (conventional techniques require two pass transistors to perform the MUX function);

(c) it is only necessary to route either the virtual GND control line or the virtual $V_{DD}$ control line (conventional techniques require routing two supply lines); and (d) the virtual supply control line only needs to charge/discharge the back-gate capacitance, and the voltage rail is charged/discharged by the front-gate current. Thus, the virtual supply settling time is shorter (conventional techniques require the drain of the pass transistors to be connected directly to the virtual supply line, hence a large amount of charges have to be moved to charge/discharge the voltage rail capacitance).

Figure 9:
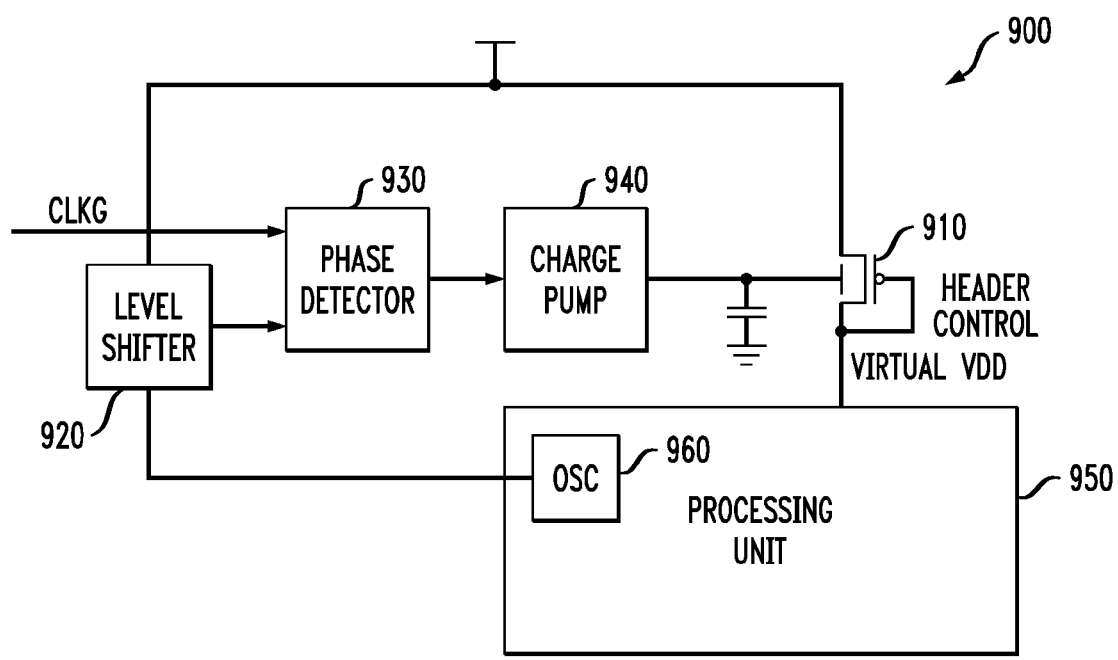
FIG. 9 depicts an "on-the-fly" virtual supply regulator that optimizes the power-performance of a processor unit using the independently controlled variable diode-drop asymmetrical double-gate device of the present invention.

FIG. 9 depicts an "on-the-fly" virtual supply regulator 900 that optimizes the power-performance of a processing unit 950 using the back-gate controlled variable diode-drop asymmetrical double-gate device 910 of the present invention. When a whole processor unit is gated, an oscillator (OSC) 960 is designed to match the unit cycle time within a predefined margin. As shown in FIG. 9, the output of the oscillator 960 goes through a level shifter 920, and is then compared with a clock signal CLKG through a phase detector 930. If the output of the oscillator 960 is slower than CLKG, the charge pump 940 will lower the back-gate bias for the pFET header diode to speed up the unit. If the output of the oscillator 960 is faster than CLKG, the charge pump 940 will raise the back-gate bias to slow it down. Thus, the unit 950 will maintain its required performance at the lowest supply voltage (hence lowest power).

It is to be understood that the embodiments and variations shown and described herein are merely illustrative of the principles of this invention and that various modifications may be implemented by those skilled in the art without departing from the scope and spirit of the invention.

What is claimed is:

1. A processor unit, comprising:
    an oscillator;
    at least one independently controlled asymmetrical double-gate device that provides a variable clamping function and state retention;
    a phase detector to compare an output of said oscillator to a reference signal; and
    a charge pump to adjust a back-gate bias of said at least one independently controlled asymmetrical double-gate device based on said comparison.

2. The processor unit of claim 1, wherein said adjusted back-gate bias improves a power performance of said processing unit.

3. The processor unit of claim 1, wherein said adjusted back-gate bias maintains a required performance with a reduced supply voltage.

4. The integrated circuit of claim 1, wherein said independent control comprises said back gate bias.

5. The integrated circuit of claim 1, wherein said asymmetrical double-gate device is a pMOS device comprising:
    a p+ polysilicon gate for a first gate; and
    an n+ polysilicon gate for a second gate, wherein a threshold voltage, $V_T$, is independently controlled by a bias of said first or second gates.

6. The integrated circuit of claim 1, wherein a gate of said independently controlled asymmetrical double-gate device is employed to control a clamping voltage.

* * * * *